United States Patent [19]

Jones et al.

[11] Patent Number: 5,148,962
[45] Date of Patent: Sep. 22, 1992

[54] HOLDER FOR SOLDERING A FLEXIBLE CIRCUIT BOARD TO A SUBSTRATE

[75] Inventors: Marshall G. Jones, Scotia; Jerry T. Harrison, Schenectady; Joseph E. Piel, Jr., Scotia; Lowell S. Smith, Schenectady, all of N.Y.

[73] Assignee: General Electric Company, Schenectady, N.Y.

[21] Appl. No.: 702,551

[22] Filed: May 20, 1991

[51] Int. Cl.⁵ .................. H05K 13/04; H05K 3/34
[52] U.S. Cl. .................... 228/49.1; 439/83; 361/412
[58] Field of Search .............. 228/212, 213, 49.1; 439/65, 67, 83; 361/400, 411, 412

[56] References Cited

U.S. PATENT DOCUMENTS

| | | | |
|---|---|---|---|
| 4,087,146 | 5/1978 | Hudson, Jr. | 439/67 |
| 4,697,061 | 9/1987 | Spater et al. | 219/121.64 |
| 4,799,755 | 1/1989 | Jones | 219/121.6 X |
| 4,926,022 | 5/1990 | Freedman | 219/121.64 X |
| 4,978,307 | 12/1990 | Billman et al. | 439/83 |

*Primary Examiner*—Kenneth J. Ramsey
*Attorney, Agent, or Firm*—James R. McDaniel; Paul R. Webb, II

[57] ABSTRACT

This invention relates to soldering systems of the type that provide localized soldering through the use of lasers. Such structures of this type generally allow flexible printed circuit boards to be locally soldered to metallized ceramic substrates. These structures have applications in such areas as ultrasound equipment.

6 Claims, 2 Drawing Sheets

HOLDER FOR SOLDERING A FLEXIBLE CIRCUIT BOARD TO A SUBSTRATE

BACKGROUND OF THE INVENTION

1. Field of the Invention

This invention relates to soldering systems of the type that provide localized soldering through the use of lasers. Such structures of this type generally allow flexible, printed circuit boards to be locally soldered to ceramic substrates.

2. Description of the Related Art

It is known in prior, soldering systems for soldering flexible printed circuit boards to substrates to employ a conventional wire bonding technique. In particular, wires of approximately 0.3 mm in diameter are initially bent so they can be easily bonded to the substrate and the circuit board while the circuit board is being held perpendicular to the substrate. The wires are first bonded to the circuit board and then they are bonded to the substrate. It was discovered that the operator must be very careful when placing the circuit board against the substrate because the brittle ceramic substrate could not withstand a high load factor. Also, the size of the wires to be bonded was a limiting factor in that an operator could not bond wires smaller than, typically, 0.3 mm in diameter. Consequently, it would be advantageous if such amounts of complex steps could be reduced while using smaller diameter wires and still avoiding a high load factor on the substrate.

In order to avoid possible damage to the substrate by substrate deformation, lasers began to be used in order to simply solder the leads from the flexible printed circuit board to the substrate. Exemplary of this method is U.S. Pat. No. 4,799,755 which is assigned to the same assignee as the present invention. However, it was soon discovered that while the use of the laser eliminated the downward force on the substrate, this particular laser could only be used on a limited variety of substrates, namely, glass/epoxy substrates. This is an important consideration because there is a current need in medical diagnostic devices, especially ultrasound imaging devices, to develop a two-dimensional array of piezoelectric sensors in order to acquire more patient information from the ultrasound imaging device. In order to acquire this greater amount of information, it was contemplated that ceramic substrates with this two-dimensional array of sensors made from the substrate are needed for construction. The method as set forth in the prior art, particularly, that method as set forth in U.S. Pat. No. 4,799,755 would not be applicable in this case because the epoxy/glass substrate technology cannot be applied to this application. In particular, an epoxy/glass substrate is a heat insulator while a ceramic substrate which has been coated with a metal coating is a heat conductor. When soldering is done to a heat insulator, there is very little concern as to how the heat from the soldering process is going to affect adjacent solder joints that have already been completed. However, when soldering to a heat conductor, there is a great concern as to how the heat from the soldering process is going to affect adjacent solder joints. There is also concern not to damage the thermally sensitive piezoelectric material during the soldering process so the Curie temperatures (150°-400° C.) of piezoelectric materials must be exceeded. Therefore, when dealing with highly heat conductive substrates, the operating parameters of the laser soldering process and the dimensions of the solder pads must be carefully controlled. However, a still further advantageous soldering system, then, would be presented if the soldering could be performed on a large variety of substrates while still employing the highly advantageous results achieved through the use of lasers.

It is apparent from the above that there exists a need in the art for a soldering system which can perform localized soldering and which at least equals the performance characteristics of the known laser soldering systems, particularly those of the highly advantageous type disclosed in U.S. Pat. No. 4,799,755, but which at the same time allows the localized soldering to be performed on a greater variety of substrates, especially metallized ceramic substrates. It is a purpose of this invention to fulfill this and other needs in the art in a manner more apparent to the skilled artisan once given the following disclosure.

SUMMARY OF THE INVENTION

Generally speaking, this invention fulfills these needs by providing a method for localized soldering of a flexible printed circuit board to a substrate having a ceramic substrate having metallic pads, solder pads, a flexible printed circuit board having fingers, a holder means, and a laser means having a laser beam, the steps of which are comprised of: treating said circuit board to create said fingers on circuit board such that said fingers extend beyond said circuit board; coating said substrate with a metallic material to create said metallic pads such that said metallic pads are substantially located at predetermined locations on said substrate; coating said substrate with a solder to create said solder pads such that said solder pads are located substantially on said metallic pads; placing said circuit board in said holder; registering and aligning said fingers on said pads to create pre-soldered connections; and impinging said laser beam on at least one of said pre-soldered connections in order to reflow said pre-soldered connections to create a solder connection.

In certain preferred embodiments, the substrate is constructed of a piezoelectric ceramic such as lead zirconate titanate, hereinafter referred to as PZT, or alumina ceramics. Also, the printed flexible circuit board is a tape automated bonding type, hereinafter referred to as TAB. Finally, the laser is a 1.06 micron line from a continuous wave Nd:YAG laser coupled with a 600 micron diameter fiber optic.

In another further preferred embodiment, the TAB can be locally soldered to the ceramic substrate without substantially affecting the solder joints of adjacent fingers or the solder joints of any adjacent TAB.

The preferred soldering system, according to this invention, offers the following advantages: good stability; excellent localized soldering; good durability; excellent finger/solder pad alignment; good economy; high strength for safety; and an increased variety of substrates that can be used. In fact, in many of the preferred embodiments, these factors of alignment and an increased variety of substrates are optimized to an extent considerably higher than heretofore achieved in prior, known localized soldering systems.

BRIEF DESCRIPTION OF THE INVENTION

The above and other features of the present invention which will become more apparent as the description proceeds are best understood by considering the following detailed description in conjunction with the accompanying drawings wherein like characters represent like parts throughout the several views and in which:

FIG. 1 is a schematic representation of a localized soldering system, according to the present invention; and FIG. 2 is a schematic illustration of solder joints being formed between the TAB and the substrate.

DETAILED DESCRIPTION OF THE INVENTION

Prior to soldering a TAB to a ceramic substrate, finger leads on the TAB must be constructed according to a conventional, well-known process. In particular, the TAB usually is made of a Kapton ® sheet, which is manufactured by DuPont, and is coated with a conductive copper laminate. After the pattern on the TAB has been produced by a conventional photolithographic technique, the edge of the TAB is etched away by conventional etching techniques to leave exposed longer finger leads. The finger leads are then tinned by well known metal coating techniques. In the preferred embodiment in this invention, the finger leads are approximately 75 microns wide by 25 microns thick and extend approximately 0.5 mm beyond the edge of the Kapton ® sheet.

With respect to the substrate, the substrate is preferably constructed of PZT or any suitable alumina ceramic. The substrate is metallized by conventional metal coating techniques such as sputtering or electroplating. Also, additional metallic pads with a thickness of 4-7 microns and a diameter of approximately 75 microns are placed on top of the metallized substrate by conventional electroplating techniques. Finally, a suitable solder is typically electroplated to the top of the pads such that the solder pad thickness is now between 10-20 microns. This substrate treatment technique is conventional such that there is a pad for each finger lead.

Figure 1:
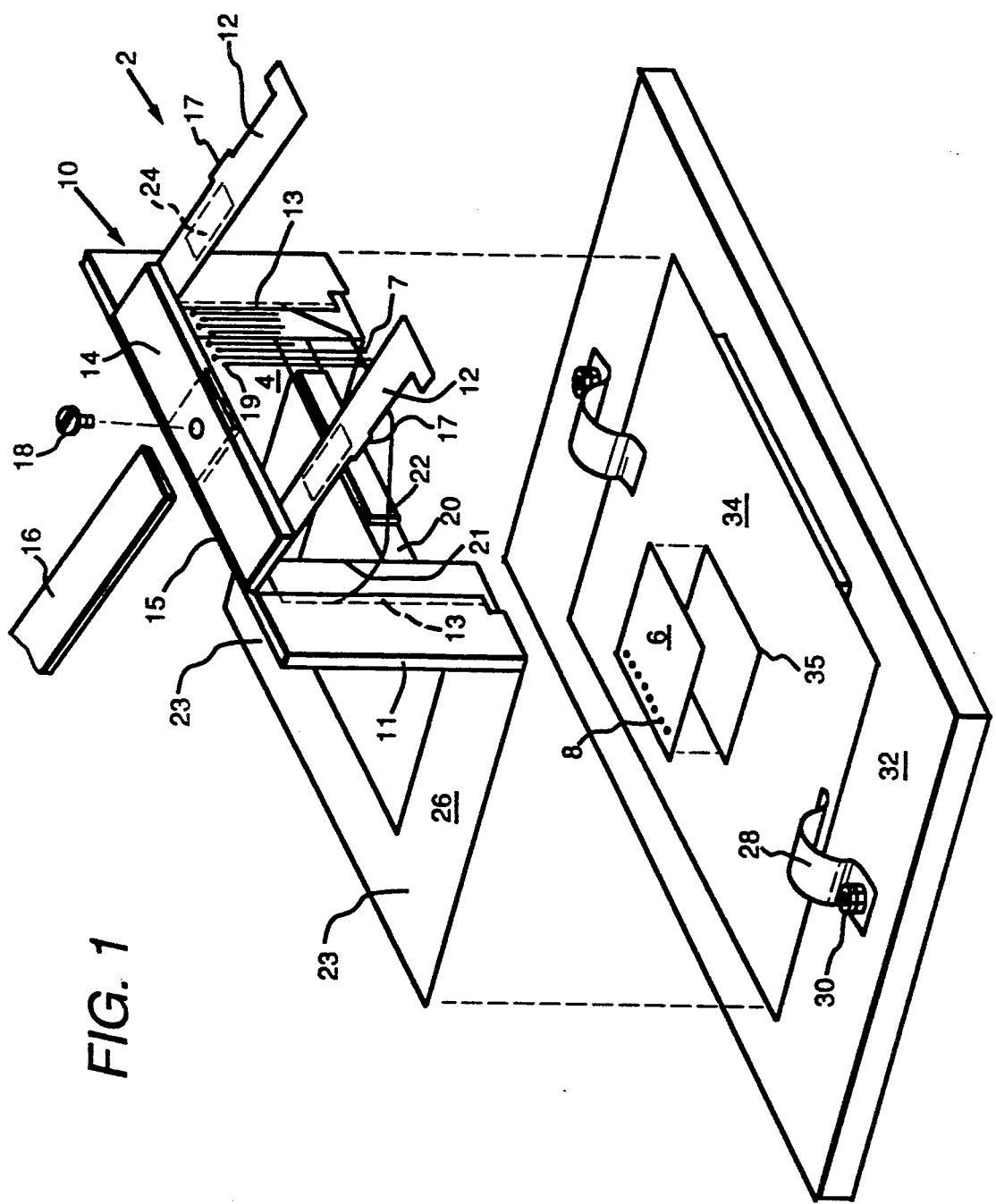

With that background in mind, FIG. 1 shows holder 2 for holding TAB 4 on substrate 6. In particular, TAB 4 includes finger leads 7 which are in physical and electrical contact with solder pads 8 and metallic pads 9 (FIG. 2) when holder 2 is placed on top of guide 34. Holder 2 includes vertical holder 10 having frame 11, door 12, retainer 14, finger 16, fastener 18, brace 20 having cushion 22, cushion 24, L-shaped bracket 26, clip 28, fastener 30, base 32, and guide 34.

Vertical holder 10, preferably, is constructed of a plastic frame used primarily for holding photographic slides. Holder 10 is scored at approximately the midway point between hinge 15 on door 12 and the end of door 12 by a conventional scoring device. Holder 10 is then broken along the score lines to produce U-shaped holder 10. Retainer 14 is then rigidly attached to the top of holder 10 near hinge 15 by a conventional adhesive. Retainer 14 is, preferably, constructed of any suitable plastic material. Brace 20 is formed in bracket 26 by conventional machining techniques such as cutting. Pad 22, preferably, is constructed of any suitable soft rubberlike material and as rigidly connected to brace 20 by conventional adhesive techniques. Holder 10 is finally rigidly bonded to bracket 26 by a conventional adhesive. Bracket 26, preferably, is constructed of aluminum.

It is to be understood that in order to increase the pressure executed by door 12 on TAB 4 so that TAB 4 does not slide downward during the soldering process, pads 24 are adhesively attached to the inside of door 12 so that pads 24 exert a higher pressure on TAB 4.

With respect to base 32, base 32 includes spring clips 28, fasteners 30, and guide 34. Base 32, preferably, is constructed of plastic or stainless steel. Spring clips 28, preferably, are constructed of any suitable spring metal and are retained on base 32 by conventional fasteners 30. Located on top of base 32 is a conventional guide 34 having an opening 35. Opening 35, preferably, is constructed such that it has approximately the same thickness and area as substrate 6. Opening 35, preferably, is formed by conventional cutting or milling techniques.

Figure 2:
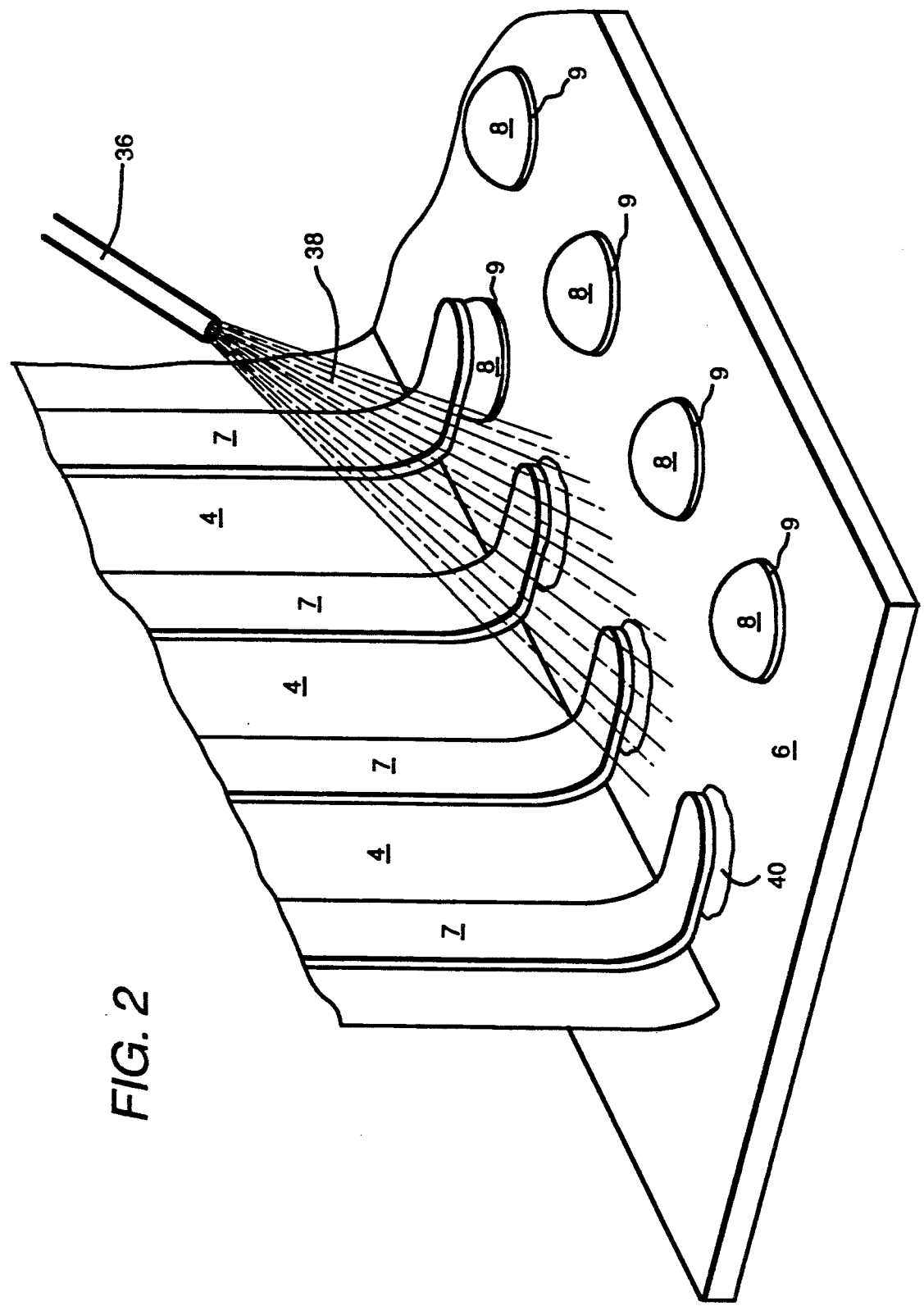

With reference to FIGS. 1 and 2, the operation of holder 2 will now be discussed. In particular, TAB 4 which has already been treated by the above-described conventional method to create finger leads 7 is placed inside holder 10 such that the edges of TAB 4 are located within grooves 13 and finger leads 7 extend approximately 0.5 to 1.0 mm beyond the bottom of holder 10 to allow for flexing of the fingers. Door 12 is swung down and latched by latches 17 such that pads 24 on door 12 and pads 22 on brace 20 provide pressure on TAB 4 to help retain TAB 4 in place. Finger 16 which is, preferably, constructed of quartz and measures approximately 8 mm wide by 2.5 cm long by 1 mm thick is placed in retainer 14 and along TAB to add extra pressure on TAB 4 to keep TAB 4 in place and to apply a downward force to keep fingers 7 in electrical and thermal contact with solder pads 8. Finger 16 is then retained in place by fastener 18.

Substrate 6 which, also, has been prepared by the above-described coating method is placed in opening 35 in guide 34 so that pads 8 will align with finger leads 7 on TAB 4 when TAB 4 is placed in physical and electrical contact with substrate 6.

After TAB 4 is placed in holder 10 and substrate 6 is placed in guide 34, holder 10 is lowered onto guide 34 so that finger leads 7 are aligned with and contact pads 8. It is to be understood that in order to properly assure that leads 7 are contacting pads 8, a conventional microscopic inspection system must be employed to view the contacting areas. Once leads 7 and pads 8 are aligned and contacting, a conventional electrical continuity check is performed. This is done by contacting leads 19 on TAB 4 which are located in window 21 in bracket 26 and the common electrical connections (not shown) on substrate 6 with a conventional voltmeter to determine if an electrical contact has been established between leads 7 and pads 8. If there is electrical continuity between leads 7 and pads 8, clips 28 are placed over the legs 23 of bracket 26 to secure bracket 26 in place.

Once bracket 26 is in place, the operator again observes the contact between leads 7 and pads 8 to determine if there is enough flex in leads 7 as they are being pressed against pads 8 (FIG. 2). This flexure allows the subsequent laser treatment to be completed with a minimum of force being placed upon substrate 6 and allows the laser treatment to easily access the area where leads 7 contact pads 8.

If the desired flexure and electrical contact have been established, the laser treatment step will begin. In particular, a 1.06 micron line from a continuous wave Nd:YAG laser coupled with a 600 micron diameter fiber optic 36 is the preferred laser. Laser beam 38 from fiber optic 36 impinges upon at least 1-3 leads 7 such that as beam 38 impinges upon lead 7, solder pad 8 begins to melt and reflow which causes leads 7 to be pulled down and become permanently bonded to pad 9.

Beam 38 traverses the entire length of leads 7 on TAB 4 until solder joints 40 are formed between all leads 7 and pads 9. After all leads 7 and pads 9 have been soldered, door 12 is unlatched and clips 28 are removed from holder 10 so that the holder 10 can be raised from substrate 6. At this point in time, TAB 4 is now rigidly connected to substrate 6. It is to be understood that if it is desired to place another TAB on substrate 6 behind TAB 4 which is already attached to substrate 6, the above operation should be repeated except that the finger leads on the TAB to be attached to substrate 6 should be aligned with and contacting another row of pads. In this manner a two dimensional array of piezo-electric sensors can be easily constructed.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. A holder for retaining a flexible circuit board while said circuit board is being locally soldered to a substrate, said holder is comprised of:
    a U-shaped holder means having legs;
    a door means attached to said U-shaped holder means;
    a bracket means rigidly attached to said U-shaped holder means;
    a base means;
    a guide means attached to said base means; and
    a first retaining means rotatably attached to said base means.

2. The holder, according to claim 1, wherein said U-shaped holder means is further comprised of:
    a groove means located along and in said leg means; and
    a hinge means located substantially between said legs such that said door means can pivot on said U-shaped holder means.

3. The holder, according to claim 2, wherein said holder is further comprised of:
    a second retainer means rigidly attached adjacent to said hinge means;
    a second spring means which slidingly engages said second retainer means and said substrate in order to bias said substrate against said U-shaped holder means; and
    a second fastener means for clamping said second spring means to said second retainer means.

4. The holder, according to claim 1, wherein said bracket means is further comprised of:
    an L-shaped support such that one leg of said L-shaped support is rigidly attached to said U-shaped holder means while said other leg of said L-shaped support is contacted by said retaining means to keep said bracket means rigidly retained on said base means.

5. The holder, according to claim 1, wherein said guides means is further comprised of:
    a retainer for holding said substrate.

6. The holder, according to claim 1, wherein said first retaining means is further comprised of:
    a first spring means; and
    a first fastener means such that said first fastener means rotatably fastens said spring means to said base means in order for said spring means to clamp said bracket means to said base means.

* * * * *